United States Patent [19]
Snyder et al.

[11] Patent Number: 5,872,533
[45] Date of Patent: Feb. 16, 1999

[54] CIRCUIT AND ARCHITECTURE FOR PROVIDING AN INTERFACE BETWEEN COMPONENTS

[75] Inventors: Warren S. Snyder, Snohomish; Timothy J. Williams, Bellevue, both of Wash.

[73] Assignee: Cypress Semiconductor Corp., San Jose, Calif.

[21] Appl. No.: 881,485

[22] Filed: Jun. 24, 1997

[51] Int. Cl.$^6$ ........................................ H03M 1/66
[52] U.S. Cl. ........................................ 341/144
[58] Field of Search ........................ 341/144, 118, 341/119, 121; 327/26, 261

[56] References Cited

U.S. PATENT DOCUMENTS 4,973,978  11/1990  Jordan .................................... 341/152

OTHER PUBLICATIONS

Universal Serial Bus Specification, Chapter 7—Electrical, Jan. 15, 1996, pp. 111–143.
C. Carrier et al., Timing Performance of Scintillators Read Out by Silicon Avalanche Photodiodes, 1990, pp. 115–118.
C. Carrier et al., Recent Results in Scintillation Detection with Silicon Avalanche Photodiodes, 1990, pp. 209–214.
Peter Rieve et al., Photo Diode with Variable Spectral Sensitivity, 1996, pp. 135–140.
Mark Kelley et al., A Digital Linescan Camera with Embedded Micro–Processor, pp. 405–409. (no date given).
L. Y. Lin et al., Velocity–Matched Distributed Photodetectors with High Saturation power and Large Bandwiddth, pp. 196–197. (no date given).
Weishu Wu et al., Frequency Response of Avalanche Photodetectors with Separate Absorption and Multiplication Layers, 1996, pp. 2778–2785.
Giampicro de Cesare et al., Variable Spectral Response Photodetector Based on Crystalline/Amorphous Silicon Heterostructure, 1996, pp. 1189–1192.
Frank J. Effenberger et al., Ultrafast, Dual–Depletion Region, InGaAs/InP p–i–n Detector, 1996, pp. 1859–1864.
E. Michel et al., Sb–Based Infrared Materials and Photodetectors for the 3–5 and 8–12 um Range, pp. 101–111. (no date given).
F. Olschner, Silicon Drift Photodiode Array Detectors, 1996, pp. 1407–1410.
David Wake, Millimetre–Wave InGaAs/InP Heterojunction Bipolar Phototransistors, 1995, pp. 61–63.
A. Gadiri et al., An Optimized CMIS Compatible Photoreceiver, 1995, pp. 211–214.
Linlin Li et al., Optimal Design of an Optimal Receiver Using Avalanche Photodiode as Both Photodetector and Electronic Mixer, 1996, pp. 24–30.
Werner Brockmann, Fuzzy System for Optical Position Sensing, 1995, pp. 747–751.
Larry Hayes, Optimizing Optical Encoder Performance, 1995, pp. 65–68.

*Primary Examiner*—Brian Young
*Attorney, Agent, or Firm*—Maiorana & Acosta, P.C.; Christopher P. Maiorana

[57] ABSTRACT

A circuit for presenting one or more current source outputs which may be used to optimize the interface between optical components in a computer system. The multiple currents may be independently varied in each particular component to provide a current adjustment for proper functioning of a wide variety of LEDs and photo transistors. As a result, a dynamic optimization of the devices is provided. Since the present invention allows a wide variety of optical components to be used, the overall cost of implementing the device may be reduced.

21 Claims, 2 Drawing Sheets

CIRCUIT AND ARCHITECTURE FOR PROVIDING AN INTERFACE BETWEEN COMPONENTS

FIELD OF THE INVENTION

The present invention relates to interface circuits generally and, more particularly, to a method, software, circuit and architecture for providing an interface circuit between various components in computer applications and other digital devices.

BACKGROUND OF THE INVENTION

Certain optical devices, such as a computer mouse, a track ball, a digitizer or a graphics tablet may be used to present a data input signal into a computer. In the example of a computer mouse, a central ball is generally coated with, or made from, a plastic or gum material which rotates as the mouse is moved. The movement of the ball is then transmitted into two small rollers that are generally perpendicular to each other. Each of the rollers converts a direction of movement of the device into an X and Y directional component by transferring the motion to two small disks having small holes. Each of the disks alternately closes or opens a photo sensor assembly that, when rotated, corresponds to the general movement of the mouse in the X or Y directions. The number of interruptions and releases of the photo sensor assembly is generally a function of a quantity equal to the amount of movement of the mouse in the particular X or Y direction. The number of interruptions and releases per second defines a functional quantity equal to the speed of the movement of the device. Other input devices function in a similar fashion by converting directional information into X and Y components using optical components.

Conventional approaches implement circuits for producing fixed bias currents for each direction (i.e., the X and Y directions) of movement of a pointing device. The fixed bias currents in conventional devices can be provided by a fixed resistor. A circuit with a fixed or variable threshold may be used to sense the state of a photo transistor. Another conventional approach uses a pulse width modulated bias current on an LED to vary the LED light output and hence the photo transistor response.

FIG. 1 illustrates a circuit 10 comprising a conventional fixed bias current device. The circuit 10 has a photo transistor (PTR) 12 and a sensing section 14. The sensing section 14 has a buffer 16 and a resistor 18. A primary disadvantage with the circuit 10 is that it does not generally tolerate a wide variation in the properties of the optical components such as the photo transistor 12. Additionally, the circuit 10 does not allow for dynamic optimization of the system performance after fabrication. For example, in the two extremes, an out of tolerance photo transistor 12 may be in a saturation mode due to the light being too bright, or may be in a cutoff mode if not enough light is present to be greater than the threshold necessary to turn on the photo transistor 12. Since each of the components of the circuit 10 is fixed, adjustments for variations in system components are not practical.

SUMMARY OF THE INVENTION

The present invention concerns a circuit for presenting one or more current source outputs which may be used to optimize the interface between optical components in a computer system. The multiple currents may be independently varied in each particular component to provide a bias current adjustment for proper functioning of a wide variety of LEDs and photo transistors. As a result, a dynamic optimization of the devices is provided. Since the present invention allows a wide variety of LEDs and photo transistors to be used, the overall cost of implementing the device may be reduced.

Other objects, features and advantages of the present invention include providing multiple current source outputs to optimize the interface between optical components, providing a method and/or software for determining the values of the multiple current sources, providing a digital to analog converter having electrostatic discharge protection, and implementing an architecture for the circuit and method.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
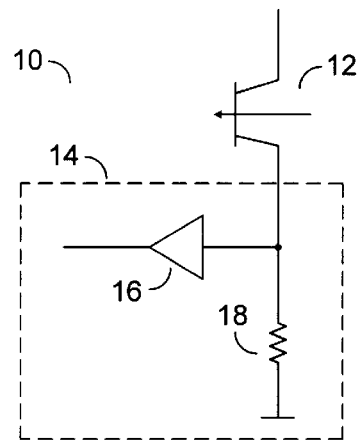
FIG. 1 is a diagram of a conventional approach for implementing an interface between optical components.
Figure 2:
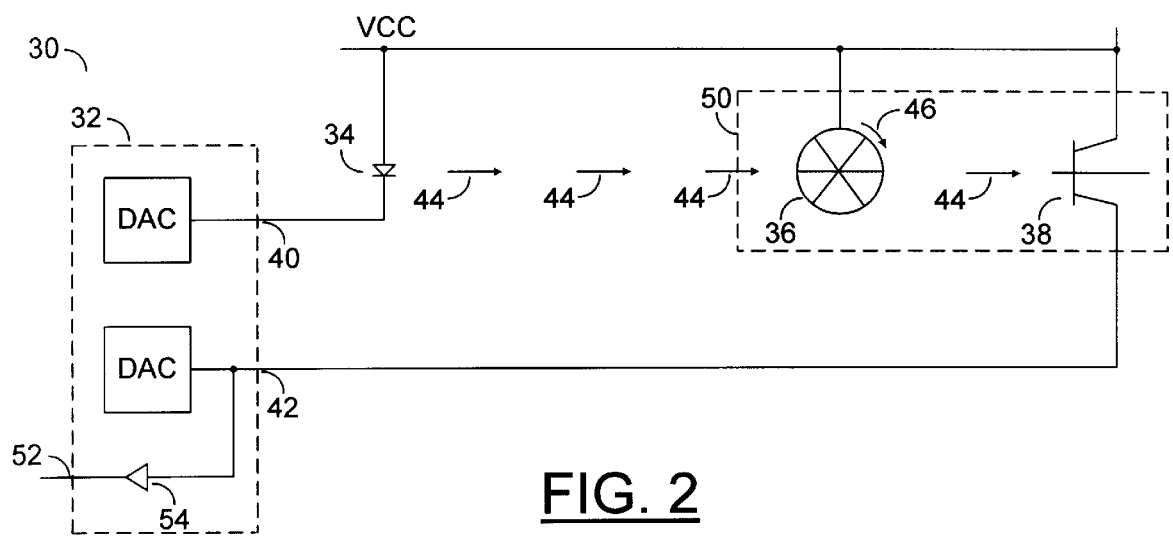
FIG. 2 is a block diagram of a preferred embodiment of the present invention.

Referring to FIG. 2, a block diagram of a circuit 30 is shown in accordance with a preferred embodiment of the present invention. The circuit 30 generally comprises a digital to analog converter (DAC) section (or circuit) 32, a light emitting diode (LED) 34, a motion device 36 and a photo transistor 38. The DAC section 32 has an output 40 and an output 42 that generally provide current sources used to optimize the interface between the optical components in, for example, a computer pointing device such as a mouse. The current sources at the outputs 40 and 42 may be independently varied to allow a wide variety of components to be properly biased. The output 40 is generally coupled to the LED 34. The output 42 is generally coupled to the photo transistor 38. The motion device 36 works in conjunction with the photo transistor 38 to provide a motion sensing block (or circuit) 50. The motion device 36 may be implemented as a photo sensor assembly that, when rotated, generally corresponds to the movement of the pointing device in a particular direction. The LED 34 may radiate light having a particular intensity that is illustrated generally by the arrows 44. An arrow 46 indicates a general direction of rotation of the motion device 36. As the motion device 36 rotates in the path of the arrows 44, the light may be interrupted in a pattern that generally corresponds to the speed of motion of the pointing device in a particular direction, since only a portion of the light generated by the LED 34 passes through the motion device 36 to be detected by the photo transistor 38.

The intensity of light produced by the LED 34 is generally controlled by the amount of current presented at the output 40. Similarly, the sensitivity of the photo transistor 38 is generally controlled by the magnitude of the current presented at the output 42. As a result, both the intensity of light produced by the LED 34 and the sensitivity of the photo transistor 38 may be controlled, to some extent, without regard to the particular specifications of the devices. For example, if the photo transistor 38 receives too much light through the motion device 36, a saturation mode may result. Such a saturation mode generally causes the signal presented at the output 52 to be unusable as a directional component signal. The circuit 30 may compensate for such a saturation mode in at least one of two ways. First, the sensitivity of the photo transistor 38 may be decreased by decreasing the magnitude of the current presented at the output 42. Second, the intensity of light produced by the LED 34 may be decreased by decreasing the magnitude of current presented at the output 40. In another example, if the intensity of light passing through the motion device 36 is too weak, the photo transistor 38 may not detect the particular directional component. The circuit 30 may compensate for a such a low light condition in at least one of two ways. First, the intensity of light produced by the LED 34 may be increased by increasing the magnitude of the current produced at the output 40. Second, the sensitivity of the photo transistor 38 may be increased by increasing the magnitude of the current presented at the output 42.

Since the sensitivity of the photo transistor 38 and the intensity of light produced by the LED 34 may be adjusted by varying the magnitude of the currents at the outputs 40 and 42, the DAC section 32 provides current sources at the outputs 40 and 42 that allow for dynamic optimization of the motion sensing block 50 and the LED 34. A wide variety of photo transistors 38 (i.e., with various sensitivities) may be implemented without having to reconfigure the circuit 30. Accordingly, a lower overall cost in implementing the circuit 30 may be realized since a wider range of photo transistors 38 and LEDs 34 may fit the specification of the circuit 30. The circuit 30 generally provides a signal corresponding to a single directional component at the output 42. To generate the complementary directional component, an additional circuit 30 may be implemented. The signal at the output 42 may also be presented to an output 52 after passing through a fixed-threshold buffer 54. The state or the directional component may alternately be buffered by a variable threshold device.

Figure 3:
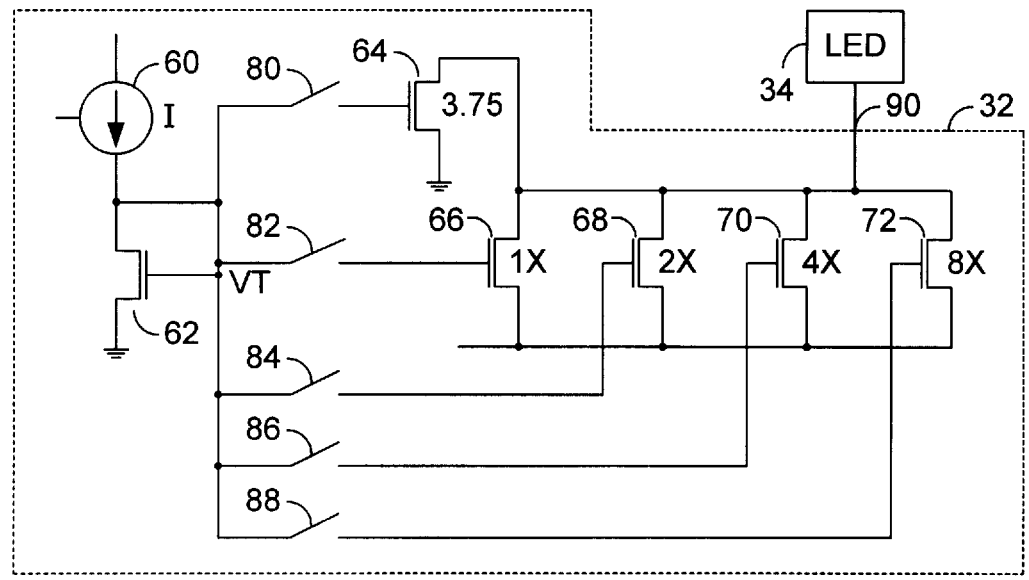
FIG. 3 is a circuit diagram of a digital-to-analog converter portion of the circuit of FIG. 2.

Referring to FIG. 3, a circuit diagram of a particular digital-to-analog converter (DAC) 32 is shown. The DAC 32 generally comprises a current source 60, a transistor 62, a transistor 64, a transistor 66, a transistor 68, a transistor 70 and a transistor 72. The current source 60 is generally coupled to a gate and source of the transistor 62. The gate of the transistor 62 is generally coupled to a node VT which may be presented to a switch 80, a switch 82, a switch 84, a switch 86 and a switch 88. A second side of the switch 80 may be presented to a gate of the transistor 64, a second side of the switch 82 may be presented to a gate of the transistor 66, a second side of the switch 84 is may be presented to the gate of a transistor 68, a second side of the switch 86 may be presented to the gate of the transistor 70, and a second side of the switch 88 may be presented to the gate of the transistor 72.

The DAC section 32 has an output 90 that may present a signal to the LED 34. The output 90, which generally corresponds to either the output 40 or the output 42 (shown in FIG. 2) generally provides a current source that may be varied in a number of equally spaced steps (e.g., 16 steps). In an example where the output 90 is generally required to vary between a fixed current (e.g., between 3.75 mA and 18.75 mA), the transistor 64 may be designed to provide the fixed amount of offset current. The transistors 66, 68, 70 and 72 may be designed to provide the particular steps (e.g., 16 steps).

In one example, the transistor 66 may be designed to provide 1 mA of current, the transistor 68 may be designed to provide 2 mA of current, the transistor 70 may be designed to provide 4 mA of current and the transistor 72 may be designed to provide 8 mA of current. Each of the transistors 66, 68, 70 and 72 may provide particular currents in response to the state of the switches 82, 84, 86 and 88, respectively. The particular currents, as well as the particular increments between the currents, may be adjusted to meet the design criteria of a particular application.

An example of the operation of the transistors 66, 68, 70 and 72 may be illustrated by the following example. If the current at the output is desired to be 10.75 mA, the transistor 64 generally provides the offset current of 3.75 mA. The additional 7.00 mA is generally provided by turning on the transistors 66, 68 and 70. Specifically, the transistor 66 may provide 1 mA of current, the transistor 68 may provide 2 mA of current and the transistor 70 may provide 4 mA of current, for a total of 7.00 mA of current. The 3.75 mA of current from the transistor 64 may be added to the 7.00 mA of current to equal the total of 10.75 mA of current. The following TABLE 1 illustrates one example of a configuration that may be used to create other current outputs where the values on the left column indicate the target current (in mA) and the numbers at the top of each column indicate the particular transistor 66–72:

TABLE 1

| | 66 | 68 | 70 | 72 |
|---|---|---|---|---|
| 3.75 | OFF | OFF | OFF | OFF |
| 4.75 | ON | OFF | OFF | OFF |
| 5.75 | OFF | ON | OFF | OFF |
| 6.75 | ON | ON | OFF | OFF |
| 7.75 | OFF | OFF | ON | OFF |
| 8.75 | ON | OFF | ON | OFF |
| 9.75 | OFF | ON | ON | OFF |
| 10.75 | ON | ON | ON | OFF |
| 11.75 | OFF | OFF | OFF | ON |
| 12.75 | ON | OFF | OFF | ON |
| 13.75 | OFF | ON | OFF | ON |
| 14.75 | ON | ON | OFF | ON |
| 15.75 | OFF | OFF | ON | ON |
| 16.75 | ON | OFF | ON | ON |
| 17.75 | OFF | ON | ON | ON |
| 18.75 | ON | ON | ON | ON |

The current range of 3.75 mA to 18.75 mA, shown in TABLE 1, illustrates possible DAC currents useful for typical LEDs. Since PTRs typically operate at much lower bias currents than LEDs, the DAC for output 42 of FIG. 2 may be configured to a different range of currents. For example, the currents may be designed to be 1/16 of the values shown in TABLE 1.

The DAC 32 is generally designed to fit within an I/O cell of a device. As a result, the transistors 66–72 of the I/O cell generally provides a DAC that incorporates electrostatic discharge (ESD) protection. While the amount of current added by the transistor 64 is shown generally as 3.75 times a unit current, the particular amount of current added may be adjusted to fit the design criteria of a particular application. Similarly, the particular values of current provided by each of the transistors 66, 68, 70 and 72 may be adjusted to fit the design criteria of a particular application. Additionally, the transistor 64 may be implemented as one or more transistors each providing a particular offset value. As such, a single DAC 32 may be used in multiple design applications which may provide specific and particular offset current values. The switches 80, 82, 84, 86 and 88 may be implemented in a variety of ways including a simple transistor having a gate connected to a control signal. The control signals may be provided by a control source such as a microprocessor or a non-volatile memory device (to be described in more detail in connection with FIG. 4).

By implementing the offset transistor as providing 3.75 mA of current, and the transistors 66–72 as providing sixteen independent states, the overall range of currents may be implemented as a 5-to-1. For example, the highest output, in this example 18.75 mA, is five times the current of the smallest output, in this example 3.75 mA. While certain applications may require different ranges of currents, a 5-to-1 range generally provides a sufficient amount of flexibility necessary to properly bias the optical elements in a typical input device. While the particular values of the current through the transistors 66–72 may be varied to meet certain design constants, the ratio of current added by each transistor may be matched within a particular tolerance (e.g. preferably within 25% and more preferably within 10%). Additionally, the amount of current added by each of the transistors 66–72 may be either a fixed amount or a variable amount.

Figure 4:
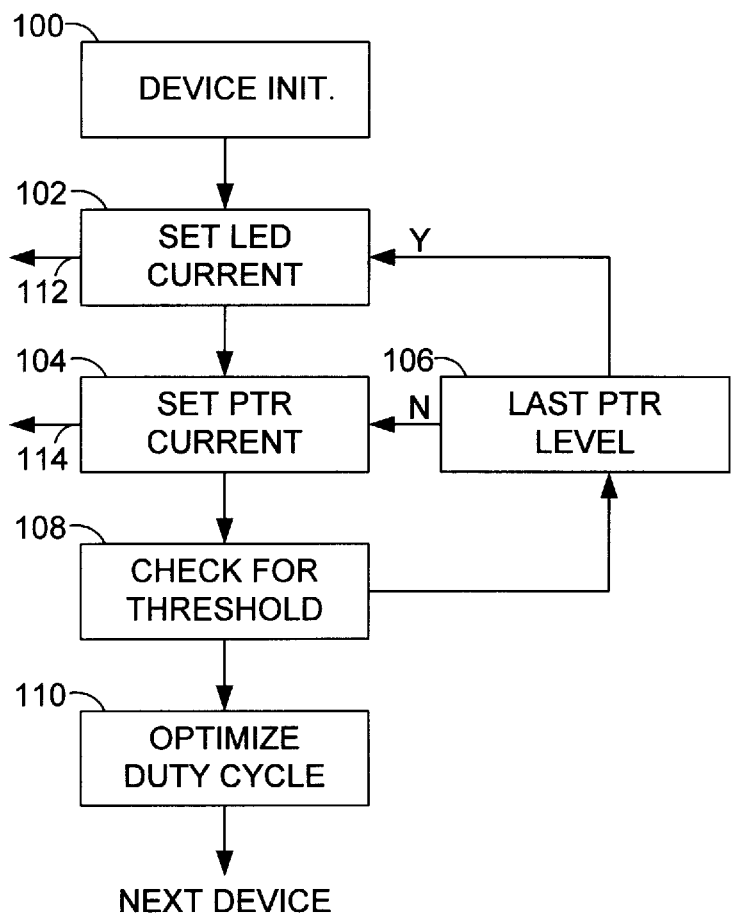
FIG. 4 is a flow chart illustrating the logic used to program the values presented to the digital-to-analog converters.

FIG. 4 generally comprises a device initialization block 100, a set LED current block 102, a set photo transistor (PTR) current block 104, a last PTR block 106, a check for threshold block 108, and an optimize duty cycle block 110. The device initialization block 100 may reset the DAC section 32. The set LED current block 102 may set the current level present at the output 112 that may be presented to the LED 34. Next, the set PTR current block 104 sets the current level at the output 114 which may be presented to the PTR 38. The check for threshold block 108 may analyze the voltages resulting at the output 42 to determine if they have met a desired threshold level. If the signal at the output 42 has not met the minimum threshold level, the last PTR level block 106 determines whether the last photo transistor level has been set. If the last photo transistor level has been set, the set LED current block 102 may set the current level present at the output 112. If the last photo transistor level has not been set, the set PTR current block 104 may be activated. The output of the set LED current block 102 generally corresponds to the output 40 shown in FIG. 2. The output 114 of the set PTR current block 104 generally corresponds to the output 42 shown in FIG. 2.

The check for threshold block 108 generally implements the logic described in connection with FIG. 2. Specifically, if the photo transistor 38 does not detect a sufficient amount of light to provide the directional component at the output 42, the output 112 or the output 114 is generally increased in order to correct for such a deficiency. Conversely, if the photo transistor 38 operates in the saturation mode, the signal presented at the output 42 may not be an accurate representation of the particular directional component. As a result, either the output 112 or the output 114 may be decreased in order to decrease the overall sensitivity of the photo transistor 38.

Once the check for threshold block 108 determines that the system is configured to detect the directional component at output 42, the optimize duty cycle block 110 may be invoked to optimize the system performance. This may generally be done by further fine tuning of the LED and PTR currents to achieve an optimal balance in the optical system. The criteria for this optimization may be, for example, achieving a 50% duty cycle at output 42, under certain operating conditions, such as during mouse movement in a computer mouse application. However, other criteria may be used in other design applications.

While the invention has been particularly shown and described with reference to the preferred embodiments thereof, it will be understood by those skilled in the art that various changes in form and details may be made without departing from the spirit and scope of the invention.

We claim:

1. A circuit comprising:
   one or more circuits each configured to generate a current source output in response to one or more control signals;
   a logic circuit configured to control a magnitude of said one or more control signals; and
   one or more devices coupled between said current source output and said control signals, wherein each of said devices provides (i) a portion of said current source output and (ii) electrostatic discharge (ESD) protection.

2. The circuit according to claim 1 wherein said one or more circuits each comprise a digital-to-analog converter.

3. The circuit according to claim 1 wherein each of said devices comprises a control circuit configured to provide said portion of said output in response to one of said control signals.

4. The circuit according to claim 3 wherein each of said devices comprises a transistor coupled between said output and said control signal.

5. The circuit according to claim 4 wherein each of said transistors are configured in parallel between said output and said control signals.

6. The circuit according to claim 5 wherein each of said transistors provides an equal portion of said output.

7. The circuit according to claim 5 wherein each successive one of said transistors provides a greater portion of said output.

8. The circuit according to claim 5 further comprising an offset transistor coupled between one of said control signals and said output.

9. A circuit for optimizing an interface between optical components comprising:
   a first circuit configured to generate one or more bias currents;
   a second circuit configured to generate a particular intensity of light in response to one of said bias currents;
   a modulator circuit configured to generate a modulated output in response to: (i) the motion of an external device and (ii) the light received from said second circuit; and
   a detector circuit configured to generate an output signal in response to: (i) the modulated output and (ii) one of said bias currents.

10. The circuit according to claim 9, wherein said second circuit comprises a light emitting diode (LED).

11. The circuit according to claim 10, wherein the intensity of light generated by said light emitting diode is generated in response to one of said bias currents.

12. The circuit according to claim 9, wherein said detector circuit comprises a photo transistor.

13. The circuit according to claim 12, wherein a sensitivity of said photo transistor is controlled by one of said bias currents.

14. The circuit according to claim 12, wherein one of said bias currents is automatically varied in response to the sensitivity of said photo transistor.

15. The circuit according to claim 14, wherein another one of said bias currents is automatically varied in response to the intensity of said light emitting diode.

16. A circuit comprising:
   means for generating a current source output in response to one or more control signals;

means for controlling a magnitude of said one or more control signals; and means for coupling said current source output and said control signals, wherein said coupling means provides (i) a portion of said current source output and (ii) electrostatic discharge (ESD) protection.

17. The circuit according to claim 16 wherein said means for generating comprises a digital-to-analog converter.

18. The circuit according to claim 16 wherein said means for generating comprises a plurality of transistors coupled between said output and said control signal.

19. The circuit according to claim 18 wherein each of said transistors are configured in parallel between said output and said control signals.

20. The circuit according to claim 19 wherein each of said transistors provides an equal portion of said output.

21. The circuit according to claim 20 wherein each successive one of said transistors provides a greater portion of said output.

* * * * *